United States Patent [19]

Lanz et al.

[11] 4,063,162

[45] Dec. 13, 1977

[54] PROCESS AND APPARATUS FOR LOCATING FAULTS ON A LINE THROUGH THE USE OF TRAVELLING WAVE SIGNALS

[75] Inventors: Otto Lanz, Niederrohrdorf; Michael Vitins, Zurich, both of Switzerland

[73] Assignee: BBC Brown Boveri & Company Limited, Baden, Switzerland

[21] Appl. No.: 677,685

[22] Filed: Apr. 16, 1976

[30] Foreign Application Priority Data

Apr. 28, 1975 Switzerland .................. 5428/75

[51] Int. Cl.$^2$ ............................................. G01R 31/08
[52] U.S. Cl. ......................................................... 324/52
[58] Field of Search ............... 324/52, 51; 317/36 D; 179/175.3 F

[56] References Cited

U.S. PATENT DOCUMENTS

| | | | |
|---|---|---|---|
| 3,281,673 | 10/1966 | Richardson | 324/52 |
| 3,590,368 | 6/1971 | Esclangon | 324/51 |
| 3,612,989 | 10/1971 | Souillard et al. | 324/52 |
| 3,670,240 | 6/1972 | Maranchak et al. | 324/52 |
| 3,723,864 | 3/1973 | Ricard | 324/52 |
| 3,800,215 | 3/1974 | Souillard | 324/52 |
| 3,878,460 | 4/1975 | Nimmersjo | 324/52 |
| 3,931,502 | 1/1976 | Kohlas | 324/52 X |
| 3,983,377 | 9/1976 | Vitins | 324/52 X |

Primary Examiner—Gerard R. Strecker
Attorney, Agent, or Firm—Werner W. Kleeman

[57] ABSTRACT

A process and apparatus for locating faults on a line, wherein at least one signal (travelling-wave signal) associated with a progression thereof at the measuring location is formed from the voltage and current at a measuring location. There are formed travelling-wave signals corresponding in number to the phases or conductors in the line and decoupled from one another in relation to the line inductances and line capacitances. At least two time-integrals are formed with these travelling-wave signals or signals derived therefrom as integrands, each time integral being associated with one direction of wave-propagation on the line. These time-integrals are processed by an evaluating function which characterizes by way of its sign and magnitude the direction and distance of the fault from a predetermined reference location on the line, which function corresponds to a relationship prevailing at the fault location between the travelling waves proceeding in opposite directions on the line.

30 Claims, 11 Drawing Figures

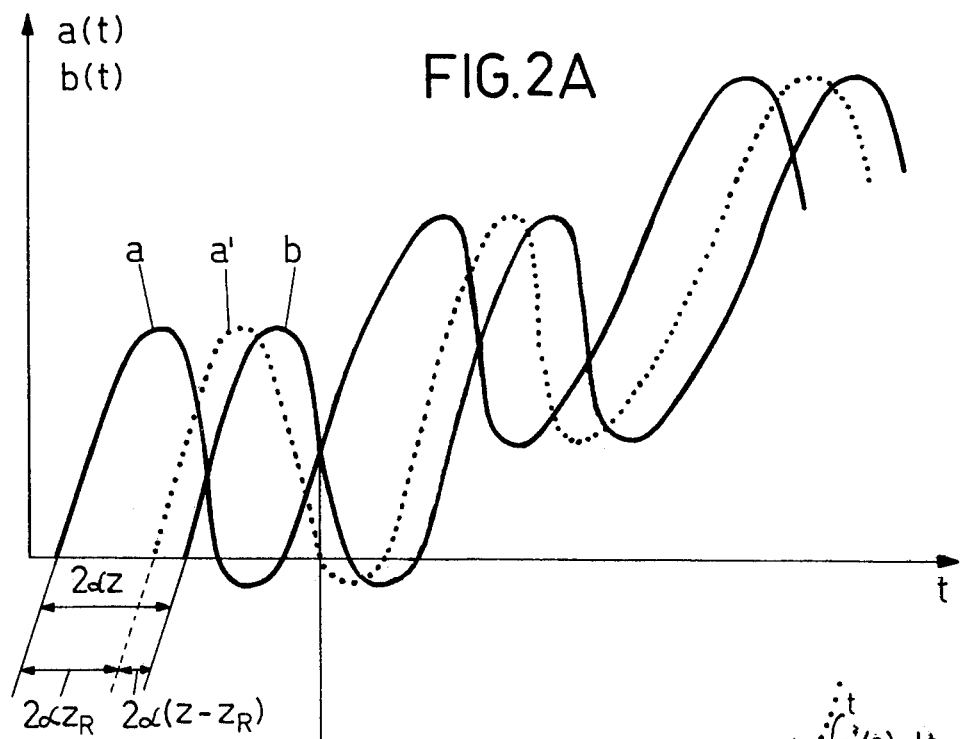
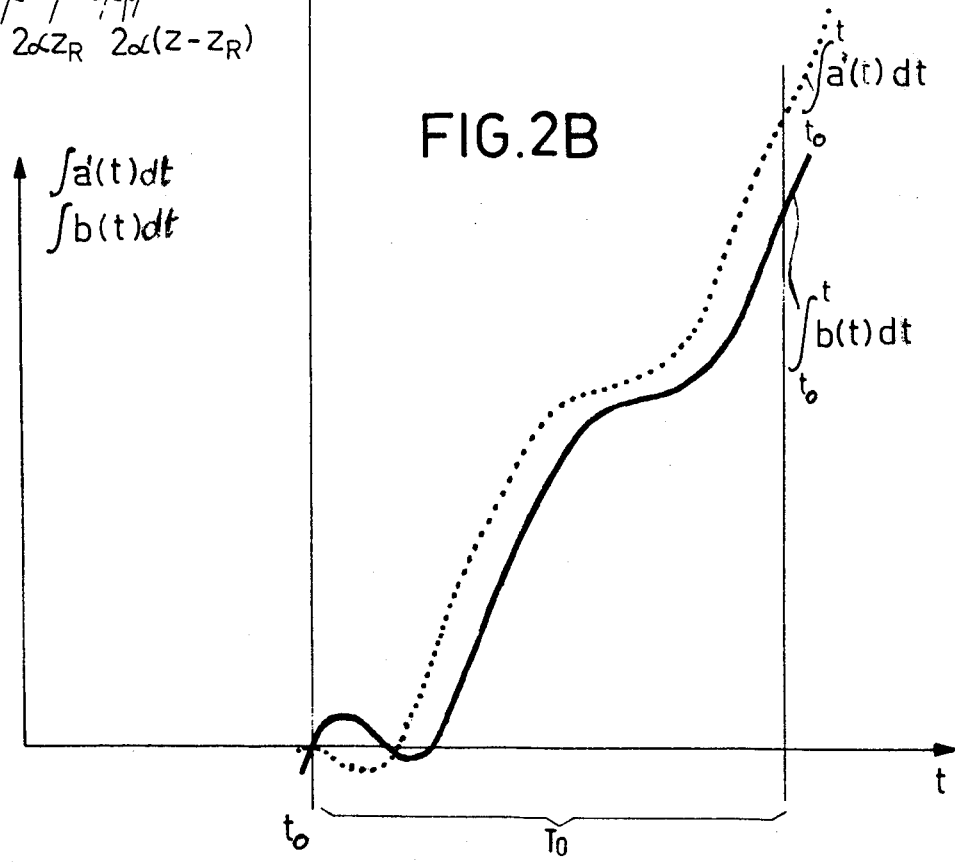

PROCESS AND APPARATUS FOR LOCATING FAULTS ON A LINE THROUGH THE USE OF TRAVELLING WAVE SIGNALS

BACKGROUND OF THE INVENTION

The present invention relates to a new and improved process for locating faults on a line, wherein at least one signal associated with a travelling wave is formed from the voltage and current at a measuring location. The present invention further relates to apparatus for carrying out such process.

The direction and/or distance of a fault with reference to a measuring location on a line, generally taking the form of short-circuits or voltage-dropping faults with little to negligible residual voltage at the fault location, are usually determined with the aid of distance relays. The latter are usually electromechanical or even electronic analogue computer elements which require substantially sinusoidal measuring and input signals in order to function correctly. However, such measuring signals are not available until some time after the fault has occurred or the fault signal has arrived at the measuring location, because the compensating operations triggered by a short-circuit first of all heavily distort the fundamental operating frequency of the line, and decay comparatively slowly. There must therefore be a corresponding time delay before vaild results are derived at a distance, or frequency filters must be used in order to enable the fundamental frequency components to be evaluated earlier. Both measures are fundamentally disadvantageous, on the one hand because it is desirable for the contactor or protective switch arranged after the distance relay to be turned on rapidly, and, on the other hand, because of undesired inertia-prone transfer functions of the filters, which likewise again lead to a time delay, and in some circumstances may even have an undesired effect on the manner in which the relay itself acts.

It would therefore be desirable to have a fault-locating process capable of functioning even while the compensating operations are in progress, and coming into action with as little delay as possible by way of its own functional progression.

In this connection, fault-locating processes working with travelling waves are already know. In these cases, a specially generated test signal with a steep wavefront is produced, and is set in motion on the line to be checked. The return to the transmitting or measuring location of the wave reflected by the discontinuity of the fault and the duration of the time interval required for outward and return transit give the distance between the fault and measuring locations, in conjunction with the known wave velocity on the line.

A disadvantage here, besides the need for a special transmitter, is the sensitivity to interfering signals such as those which appear at high intensity and in some cases with steep flanks on heavy-current lines, and above all on high-voltage lines. This sensitivity is predicated on the fact that signal-flank detection leading to temporally differential measuring processes is being used. Moreover, measurement becomes critical for fault locations very near to the measuring location in consequence of the very short transit time.

A device working with travelling-wave signals for locating faults with reference to a line section defined by two measuring stations is furthermore known from U.S. Pat. 3,590,368. In this case, voltage travelling-wave signals associated with only one direction of propagation are formed in both measuring stations from the measured voltages and measured currents at both stations, and compared with one another, after one of the two travelling-wave signals have been multiplied by the complex transmission factor of the line section, via a control line which is required besides the line to be checked. If the signals coincide, there is no fault, but if they differ there is a fault in the line section between the measuring stations.

SUMMARY OF THE INVENTION

It is a primary object of the invention, as compared to the cited state of the art, to provide a process and apparatus for locating faults which can deliver, in a relatively short time from the appearance or excitation of the fault, a signal characterising the direction and/or distance of the fault on the line, and specifically basically by detecting the voltage and current at only one measuring location.

The inventive process for locating faults on a line contemplates that at least one signal (traveling-wave signal) associated with a travelling wave on the line and corresponding to the temporal progression thereof i.e. its course as a function of time at the measuring location is formed from the voltage and current at a measuring location. The travelling-wave signals are formed corresponding in number to the phases or conductors in the line and decoupled from one another in relation to the line inductances and line capacitances. At least two time-integrals are formed with these travelling-wave signals or signals derived therefrom as integrands, each integral being associated with one direction of wave-propagation on the line. These time-integrals are associated with an evaluating function which characterises by way of its sign and magnitude the direction and distance of the fault from a predetermined reference location on the line, and which function corresponds to a relationship prevailing at the fault location between the travelling waves proceeding in opposite directions on the line.

The apparatus for carrying out the process of the invention is characterized by the following features:

a. a voltage- and current-measuring circuit is provided at a measuring location on the line, the outputs of said circuit leading to voltage-current signal pairs ($u_m$, $i_m$) corresponding in number to the phase or conductors in the line and independent of one another with respect to the line inductances and line capacitances;

b. a multiplication circuit is connected to the voltage- and current-measuring circuit, in which multiplication circuit at least one of the independent current signals is multiplied by a factor ($R_w$) corresponding to a characteristic impedance associated with the relevant current signal;

c. a summation circuit is connected to the measuring circuit and to the multiplication circuit, in which summation circuit at least two travelling-wave signals in the form of $a = u_m + R_w \cdot i_m$ and $b = -u_m + R_w \cdot i_m$ are formed with $u_m$ and $i_m$ as the voltage-current signal pair and $R_w$ as the factor corresponding to an associated characteristic impedance;

d. an integrating circuit is provided for forming time-integrals of the travelling-wave signals, the integrating circuit containing an integration-interval switching device;

e. an evaluating circuit comprising at least one subtraction or comparison circuit is connected to the outputs of the integrating circuit, the inputs of said evaluating circuit being fed with time-integrals formed from travelling-wave signals proceeding in opposite directions to one another or signals derived from these time-integrals.

An essential factor of the process according to the invention is thus the formation of time-integrals from travelling-wave signals proceeding or moving in opposite directions. In this connection, a signal whereof the temporal progression i.e. its course as a function of time corresponds to that of a travelling wave observed at a definite line location is designated for the sake of simplicity as a "travelling-wave signal." This is more particularly to be understood hereinafter to mean a signal corresponding to the temporal progression of a travelling wave, provided that the position of the line location is not otherwise stated. "Travelling-wave signals proceeding in opposite directions" are accordingly to be understood to mean signals corresponding to the temporal progression of travelling-wave signals proceeding in opposite directions at a definite line location, more particularly at the measuring location.

A further essential factor is integration by way of definite integration intervals, which enables the time-integrals obtained to be logically or arithmetically processed and evaluated with little delay. More particularly, the definite start of integration with just such an initial value when the process is set in action facilitates fault-location with little delay as a result of qualitative fault-reporting ("excitation") of intrinsically customary type, because the time required for eliminating previously stored information which is not relevant to fault-location - for example discharging differently charged integrating members via discharge members having time-constants - disappears or is greatly reduced. On the contrary, in the case of the present process the integration interval represents the actual signal-processing time, at the end of which the definitive quantities for fault-location are already substantially available, and only need practically delay-free logical or arithmetical linking.

It should be noted here that the use of correlation methods with time-integration corresponding to an approach to Fourier transformation to currents and voltages for the purpose of fault-location on lines is already known (IEEE Transactions on Power Applications and Systems, Vol.PAS-93, No. 5, pp. 1522-34, published Nov. 1973). Here, however, definite frequency components of voltages or currents are merely — more or less approximately — isolated by correlation filtering and made available for customary subsequent fault-location by an impedance process. Accordingly, in this case the integration during has to last for at least one cycle of the frequency components to be filtered out — in the case of alternating-current lines generally the mains frequency — with a corresponding expenditure of time. This state-of-the-art process is not carried out with travelling-wave signals.

As opposed thereto, it is not fundamentally necessary in the case of the process according to the invention to isolate a definite frequency component or even only a fairly narrow frequency range for fault-location. On the contrary, the minimum duration of the integration interval is defined in the case of the process according to the invention by the fact that, in spite of the oscillations generally appearing in the travelling-wave signals with a cycle duration of the order of magnitude of the time taken by waves in transit via the line being observed, the time-integrals no longer overlap. Therefore at the end of integration there is an unambiguous association between the sign of the differences of the time-integrals for the travelling-wave signals proceeding in opposite directions and the direction of temporal displacement between these travelling-wave signals. This is generally not the case when integration intervals are extremely short, because the time-integrals, considering the random position at which integration starts, first of all exhibit correspondingly random-conditioned size relationships with respect to said higher-frequency oscillations. However, practical investigations have shown that integration intervals of a few milliseconds suffice in order to obtain unambiguous information as to the fault-location-dependent time displacement between the travelling-wave signals, and thus to reach an unambiguous decision regarding the direction of the fault location with respect to the reference location.

The evaluating function may also take other forms than the simple difference between one respective time-integral of the two travelling-wave signals proceeding in opposite directions, especially the difference between two products formed from a plurality of travelling-wave-signal time-integrals (to be more precisely explained later). For such forms of embodiment, it is no longer important for there to be freedom from overlap of the time-integral functions of the travelling-wave signals as such, but in some circumstances it is important for there to be freedom from overlap of the subtractively linked polynomial terms formed from the travelling-wave time-integral functions. For this purpose, it may suffice if the integration intervals are of shorter minimum duration than those encountered in the case of simple difference-formation of the time-integrals. It is thus possible to obtain particularly favorable evaluating functions.

The formation of travelling-wave signals of definite propagation velocity and associated characteristic impedances presumes that there is no coupling with other travelling waves of generally different propagation velocities and characteristic impedances. Besides, this presumption is only complied with in the case of lines with only one conductor or one phase with respect to earth or ground, so that the travelling-wave signals may be formed directly from measured voltage and measured current: $a(O,t) = u_m + R_w \cdot i_m$ and $b(O,t) = -u_m + R_w \cdot i_m$ with the measured voltage $u_m$ and the measured current $i_m$. In the case of multiple-conductor systems, the measured voltages and measured currents must on the contrary be transformed into decoupled fictitious line signals - apart from the case of conductors which are very far from one another and therefore practically decoupled.

A reference location is expediently fixed on the line by introducing a certain mutual variation between two associated travelling-wave signals proceeding or moving in opposite directions, preferably by imparting additional time delay to one of the two travelling-wave signals with respect to the other. This is accomplished by mutually displacing the integration intervals for the two directions of propagation or by multiplying the associated travelling-wave signals proceeding in opposite directions by temporally displaced weighting functions, with subsequent integration. A definite reference location, i.e. a distance between the measuring location and reference location, is associated with such temporal displacement. If a fault location coincides with this reference location, the transit-time displacement between the travelling-wave signals at the measuring location is just compensated for by the pre-set temporal displacement or mutual variation, and the two corresponding terms of the evaluating function obtained from the time-integrals, and to be compared with one another or subtracted, agree with one another. On the contrary, a fault-location position differing in one direction or the other from the reference location causes the result of comparison or subtraction or the evaluating function to have a positive or negative sign, and this causes the direction of the fault location with respect to the reference location to be correspondingly detected. This advantageously makes it possible for any portions or sections of a line, bounded if desired by two different reference locations, to be monitored from a single measuring location as regards a fault occurring in them. It is then usually unnecessary for the fault distance to be more accurately determined, but fundamentally this may likewise be done by quantitatively evaluating the time-integrals.

Moreover, the temporal or time displacement may also be simultaneously introduced in a plurality of the magnitudes or parameters of the process, in which case a resultant reference location is produced in some circumstances. On the other hand, there need not necessarily be a temporal displacement, but fundamentally consideration may also be given to differing weighting functions with a different temporal center of gravity or integration intervals. In this connection, it is not absolutely necessary for the associated reference location to be analytically predetermined or calculated, even if it may usually be desirable. Basically, the procedure may involve the associated reference location, with coincidence of the terms of the evaluating function which are to be compared, being empirically determined, if desired by means of a simulator, when the travelling-wave signals or time-integrals undergo a given mutual variation. This does not lead to any great expenditure, because the manner in which the process proceeds or the operation of the corresponding fault-locating device has to be defined or adjusted once.

It has so far been shown that information which will locate a fault can fundamentally be obtained with one integration for each of two travelling-wave signals proceeding in opposite directions. In the case of the predominant use in conjunction with alternating-current lines, the travelling-wave signals now comprise, even after the fault has started, and thus more particularly after the short-circuit has started, a predominant mains-frequency component, the cycles of which define the rough course or progression of the travelling-wave signals, and thus correspondingly rising and falling portions and passages through zero of the travelling-wave signals. This dominant periodicity is again to be found in the travelling-wave time-integrals, no matter what the duration of the integration intervals. Thus one and the same temporal or time displacement i.e. time shift between the travelling-wave signals moving in opposite directions leads to the time-integrals for the random-conditioned position of the integration intervals being oppositely related in magnitude in the rising or falling portions of the temporal progressions of the integrals. In order to eliminate the resultant ambiguity as regards deciding on the directions of the fault location and reference location, it is necessary either for the temporal position of the start of integration with respect to the cycles of the dominant mains-frequency component to be additionally detected — for example additional phase-detection of the usual kind — or for a plurality of — generally two — time-integrals to be formed for at least one of the two travelling-wave signals proceeding in opposite directions. The last-named multiple integration is preferably used for each direction of propagation, because this requires only comparatively slight extensions to the steps of the process and to the associated circuit.

For example, consideration may be given to the formation of two time-integrals for each travelling-wave signal with one temporal displacement between the relevant travelling-wave signals. The magnitude of this temporal displacement must be adapted to the duration of a cycle of the dominant fundamental frequency or oscillation of the travelling-wave signals which is presumed to exist in the case of alternating-current lines. A displacement of the order of magnitude of a quarter-cycle of the fundamental oscillation is expedient. The evaluating function is then formed from the four time-integrals, expediently in the form of a product polynomial, each of the two polynomial terms representing the product of one time-integral of one travelling-wave signal and one time-integral of the other, that is to say, of the displaced travelling-wave signal. In this way, a sign again can be unambiguously allotted to the evaluating function in order to determine the direction of the fault location with respect to the reference location. A corresponding effect may also be attained by multiple integration with differing integration intervals, and by weighting the travelling-wave signals with different, more particularly temporally i.e. time displaced, weighting functions for each direction of propagation and integrating the product functions thus obtained. If desired, the decision as to the position of the time-integral may also be reached in the rising or falling portion of the travelling-wave signal by additional integration for only one direction of propagation.

BRIEF DESCRIPTION OF THE DRAWINGS

The invention will be better understood and objects other than those set forth above, will become apparent when consideration is given to the following detailed description thereof. Such description makes reference to the annexed drawings wherein.

FIG. 2A shows a time diagram of two oppositely moving travelling-wave signals;

FIG. 2B shows a time diagram of the travelling-wave-signal-time-integral functions belonging to FIG. 2A;

DETAILED DESCRIPTION OF THE INVENTION

Figure 1:
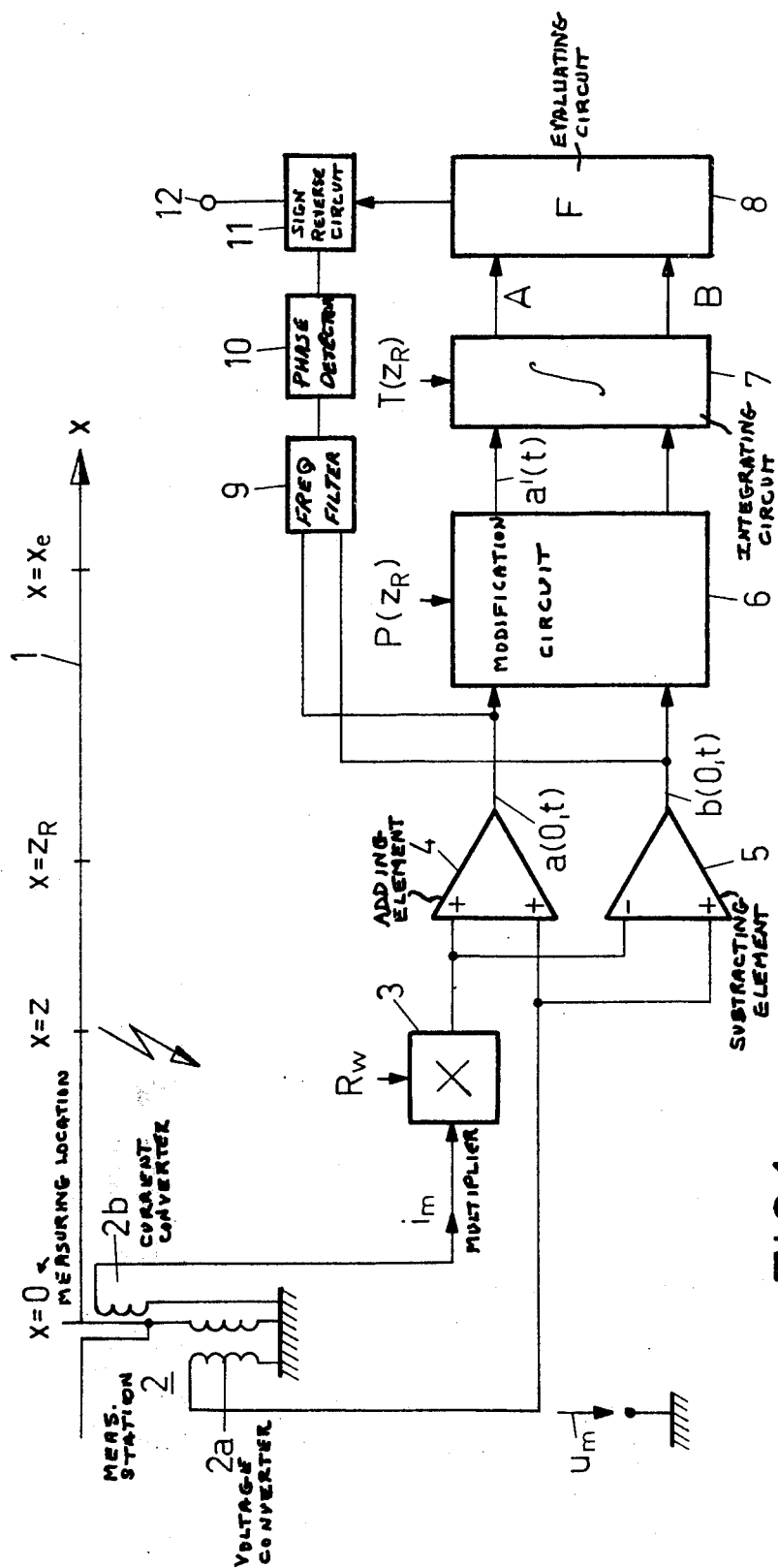
FIG. 1 is a block circuit diagram of a line with a measuring station and signal channels for travelling waves proceeding in opposite directions, and a signal-processing and evaluating circuit.

Describing now the drawings, the manner in which the invention functions will first of all be explained with reference to FIGS. 1 to 5 for a line consisting of a conductor 1 (see FIG. 1), with a measuring station 2 at the measuring location $x = 0$, from which location the line coordinate $x$ is for example positively calculated to the right. Accordingly, let $x = x_e$ be the end of a line section to be considered, $x = z$ the location of a fault assumed to be a short-circuit with a leak or cross-resistance of zero, and $x = z_R$ a predetermined reference location on the line having the significance of a fictitious fault location and fundamentally capable of being set by certain parameters of the process or circuit.

The measuring station 2 comprises a voltage converter 2a for detecting the measured voltage $u_m$ and a current converter 2b for detecting the measured current $i_m$. The measured current $i_m$ is multiplied in a multiplier 3 by a factor having the significance of a wave or characteristic impedance, thus in a simple example the real or effective characteristic impedance given directly by the line coverings $L'$ and $C'$ (inductance and capacitance per unit length), there being assumed to be no losses by $R_w = \sqrt{L'/C'}$. There are then formed in the subsequent adding or summing element 4 and subtracting element 5 the oppositely moving travelling-wave signals $$a(0,t) = u_m(t) + R_w \cdot i_m(t)$$

and $$(0,t) = -u_m(t) + R_w \cdot i_m(t).$$

The following consideration may be introduced in order to explain the further signal processing: From the wave equations $$\frac{du(x,t)}{dx} + L' \frac{di(x,t)}{dt} = 0, \frac{di(x,t)}{dx} + C' \frac{du(x,t)}{dt} = 0 \quad (2)$$

for the line, assumed to be loss-free, carrying the voltage $u(x,t)$ and the current $i(x,t)$ there follow for the fault condition, that is to say in the case of the example the short-circuit condition, at the fault location $x = z$, namely $$u(z,t) = 0, \quad (3)$$

the solution ($\alpha = \sqrt{L' \cdot C'}$ = reciprocal wave-propagation velocity):

$$2u(x,t) = R_w \cdot (i(z,t + \alpha(z-x)) - i(z,t - \alpha(z-x))) \quad (4)$$

$$2i(x,t) = i(z,t + \alpha(z-x)) + i(z,t - \alpha(z-x)),$$

where $i(z,t)$ is the current at the fault location, that is to say the short-circuit current. Accordingly the line voltage, as is clear from the expression $$2u(x,t) = a(x,t) - b(x,t) \quad (5)$$

is additively made up at each line location from the travelling waves proceeding in opposite directions $$a(x,t) = R_w \cdot i(z,t + \alpha(z-x)) \quad (6)$$

and $$b(x,t) = R_w \cdot i(z,t - \alpha(z-x)).$$

For the correlation of these travelling waves, which have the dimension of a voltage, with the line voltages and the line currents, the following relationship applies on account of Equations (4) and (6)

$$a(x,t) = u(x,t) + R_w \cdot i(x,t) \quad (6a)$$

and $$b(x,t) = -u(x,t) + R_w \cdot i(x,t).$$

It may be observed at this point that analogous travelling-wave and fault-location conditions may also be set up for a break in a line with an open circuit at the fault location and corresponding travelling waves, and evaluated for locating the fault. Furthermore, the disclosed method of fault-location is appropriate for use with line faults lying between short circuit and open circuit, with reflection of the travelling waves at the fault point.

The following thus applies for the reference location $x = z_R$ introduced for the purpose of subdividing the line into regions to be monitored with a view to the position of the fault location $$a(z_R,t) = R_w \cdot i(z,t + \alpha(z-z_R)) \quad (7)$$

and $$b(z_R,t) = R_w \cdot i(z,t - \alpha(z-z_R)).$$

The mutual temporal or time displacement $$\Delta t_R = 2\alpha(z - z_R) \quad (8)$$

thus comprises an item of information which suffices for localising the fault due to the sign and if appropriate the value of $z - z_R$. Direct determination of the displacement interval relevant to the fault location encounters substantially difficulties, on account of which the present invention adopts the method of evaluating time-integrals of the travelling-wave signals which involves linking these time-integrals by an evaluating function which characterises the direction and distance of the fault location with respect to the reference location.

Due to the introduction of a reference location which may be predetermined in any fashion, the location of faults on the line in most uses be solved by a decision as to direction with respect to a suitably chosen reference location or a plurality of such locations. This is especially so since in practice only one fault usually has to be located in definite regions of the line in order to decide whether to switch-off or disconnect the faulty line section. Such a decision as to direction may be reached by comparatively simple evaluating functions, for example even by simple subtractive linking of two integrals of travelling-wave signals moving in opposite directions, provided that additional detection is carried out for the temporal position of the integration intervals with respect to the rising or falling half-cycle of any dominant fundamental oscillation which is usually present in the spectrum of the travelling-wave signals. Such a very simple evaluating function F is assumed hereinafter in order to clarify the explanation. The following would apply for the travelling-wave time-integral functions $A_R$, $B_R$ at the reference location and the evaluating function formed therefrom:

$$F = A_R(t) - B_R(t) = \int_{t_o}^{t} a(z_R,t)dt - \int_{t_o}^{t} b(z_R,t)dt \quad (9)$$

with $$F = 0 \text{ for } z_R = z \text{ due to } 2u(z,t) = a(z,t) - b(z,t) = 0 \quad (10)$$

$$F \lessgtr 0 \text{ for } z_R \lessgtr z \text{ or conversely } F \lessgtr 0 \text{ for } z_R \lessgtr z \quad (11)$$

but in any case with the sign of $F_R$ reversed for fault-location positions on both sides of $z_R$, as for a decision as to direction — apart from the previously mentioned additional phase detection — being basically sufficient.

Due to Equation (7) the following applies:

$$a(z_R,t) = a(O, t - \alpha z_R), \quad (12)$$

and $$b(z_R,t) = b(O, t + \alpha z_R),$$

and thus the time-integrals required for evaluation may be obtained for the travelling-wave signals $a(O,t)$ and $b(O,t)$ present at the measuring location.

If the travelling-wave signals $a(O,t)$ and $b(O,t)$ available at the measuring location are now subjected to a mutual temporal displacement $\Delta t$, this displacement then corresponds to a line location $z_R = \Delta t/2\alpha$, which takes the form of the fault location and makes the time-integrals A and B formed at the measuring location equal to one another for equal integration intervals, and thus makes the initially considered simple evaluating function $F = A - B$ equal to zero. Thus, there exists a predetermined variation, defining a reference location $z_R$, of the temporal progression or course as a function of time of the travelling-wave signals moving in opposite directions in relation to one another. This variation or change is such that the variation in the time-integrals and in the evaluating function resulting from this variation in the travelling-wave signals is just compensated for by a fault appearing at the reference location, as compared to an identical progression of the travelling wave signals with correspondingly coinciding time-integrals which make the evaluating function zero.

Investigations and practical tests which will not here be discussed in detail shown that this method for locating the fault with respect to a reference location can likewise be complied with in more general form with the desired effect. First of all, the temporal displacement between the travelling wave signals may be replaced or supplemented by a temporal displacement of time shift between the associated integration intervals. Consideration may furthermore be given to multiplying the travelling-wave signals by mutually displaced but otherwise coinciding temporal weighting functions. In addition, however, a reference location may also be obtained by other mutual modifications of the temporal progression of the oppositely moving travelling-wave signals, for example by multiplying by weighting functions which differ by way of a constant amplitude factor or also by way of an otherwise varying temporal progression, or also in that the integration intervals are of differing duration, provided that this modification can be compensated for, as regards the effect on the time-integrals or on the evaluating function, by a temporal displacement of the original travelling-wave signals which is independent of the progression or course of said signals themselves and can thus be unambiguously associated with a reference location.

In the basic circuit arrangement according to FIG. 1, the reference location is fixed as hereinbefore explained in a modification circuit 6 which is fed at the input end with $a(O,t)$ and $b(O,t)$, and which comprises a control or setting input $P(z_R)$ for a temporal or other reference-location-defining process parameter, or in a subsequent integrating circuit 7 with a control or setting input $T(z_R)$ for the integration intervals, which input may perhaps likewise define the reference location. Thus, the time-integrals A and B for determining or defining the sign and/or value of $z - z_R$ in the following evaluating circuit 8 are available at the outputs of the integrating circuit 7. In this evaluating circuit 8 there is formed from the time-integrals A and B the previously discussed evaluating function F. A phase-detector 10, for example turned on by the travelling-wave signals via a frequency-filter 9, is provided for the case of the simplest evaluating function with additional determination of the phase of the time-integrals with respect to a dominant travelling-wave-fundamental oscillation. This phase-detector 10 is furthermore supplied with the integration intervals T of the integrating circuit 7 and determines therefrom the phase of these intervals with respect to the fundamental oscillation, and correspondingly controls a sign-reversing circuit 11 arranged following the output of the evaluating circuit 8. The correct sign signal of $z - z_R$ is thus always availabe at the final output 12 of the circuit.

It should also be observed here in general fashion that the aforesaid phase-detection also applies to cases in which the dominant frequency component first appears, in consequence of a filtering action on the part of the weighting and/or integration, in the modified travelling-wave signals or in the temporal integral functions of the latter, or appears in a form differing from a dominant frequency component of the original travelling-wave signals. In the final analysis what is important is the dominant periodicity of the integral functions participating in the evaluating function, which has to be taken into account as regards unambiguous association between the sign of the evaluating function and the direction of the fault location with respect to the reference location.

The reference-location-fixing or reference location-localization and integration for the assumed signal evaluating function $F = A - B$ will now be functionally explained with the aid of FIGS. 2 and 3.

FIG. 2A shows two travelling-wave signals a and b proceeding in opposite directions which are present at the output of the adding or summation member 4 and of the subtracting member 5 according to FIG. 1, and exhibit a mutual temporal displacement $2\alpha z$, caused by a short-circuit at $x = z$, but otherwise exhibit a coincident temporal progression. In the case of the example, the reference-location-defining mutual variation of these travelling-wave signals resides in the formation of a modified travelling-wave signal $a'$, which is delayed by $2\alpha z_R$ with respect to a, and which is delivered for integration purposes besides the, for example, unchanged travelling-wave signal $b$. The travelling-wave signals $a$ and $b$, and also $a'$ and $b$, exhibit overlaps in their temporal progression which preclude a decision as to the direction of their mutual temporal displacement, and thus make it impossible to decide on the direction of the fault location by direct linking of the travelling wave signals. As opposed thereto, the time-integral functions indicated in FIG. 2B, with the even unfavorably chosen start $t_o$ of integration in the region in which the integrands pass through zero, supply functional values $A(t)$ and $B(t)$ which diverge to an increasing extent as the duration of integration increases, and which result in an evaluating function $F = A - B$ with an unambiguous allotment of sign in the sense explained above. For example $T_o$, in practice amounting to about 3 msec. with alternating-current lines, may be considered to be the minimum duration of integration which is sure to suffice.

This illustrates how the reference location is fixed by mutually delaying the travelling-wave signals, which delay may be replaced in equivalent fashion by displacing the integration intervals for $a$ and $b$.

Figure 3A:
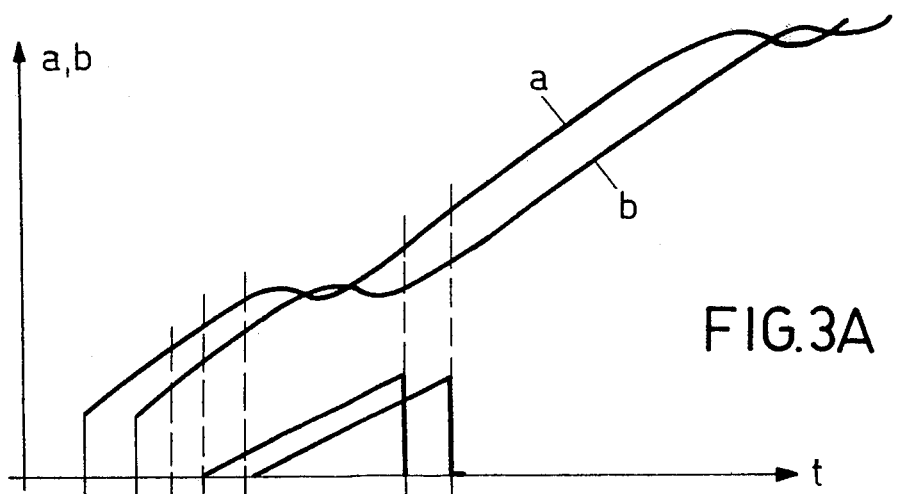
FIG. 3A shows a time diagram of travelling-wave signals proceeding in opposite direction with associated weighting functions.
Figure 3B:
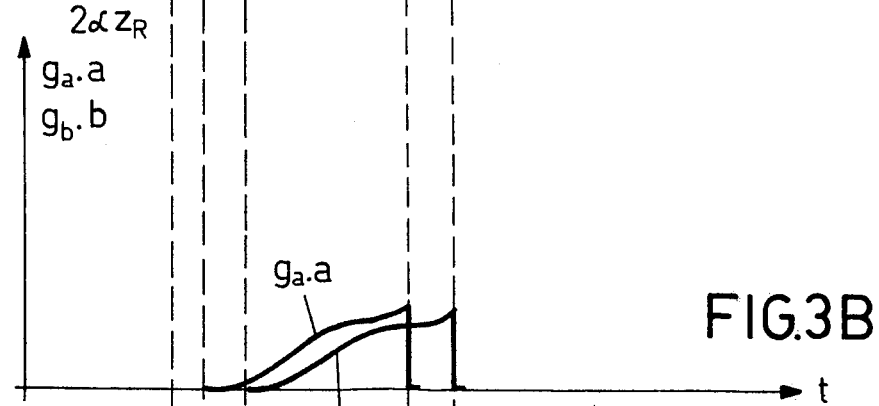
FIG. 3B shows a corresponding time diagram of the product functions formed from the travelling-wave signals and weighting functions.
Figure 3C:
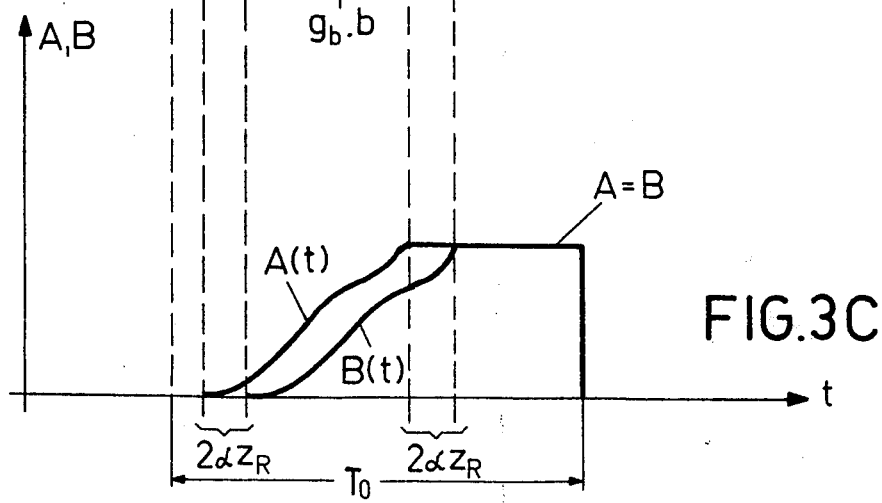
FIG. 3C shows a time diagram of the time-integrals formed from the product functions according to FIG. 3B.

FIG. 3A indicates two travelling-wave signals a and b with a fault-conditioned mutual temporal displacement of just $2\alpha z_R$, corresponding to a fault at the reference location, which is fixed here by corresponding mutal temporal displacement of two weighting functions $g_a$ and $g_b$ for the purpose of multiplication by a and b. The associated product function $g_a \cdot a$ and $g_b \cdot b$ are indicated in FIG. 3B, and the time-integral functions $A(t)$ and $B(t)$ resulting therefrom with the integration interval $T_o$ are indicatd in FIG. 3C. It is assumed that the integrating members are reset or discharged at the end of $T_o$, in which case evaluation must be previously carried out in good time. As may be seen, the final values $A(t_e)$ and $B(t_e)$ are equal to one another and thus $F = 0$, as must be the case if the reference and fault locations coincide.

This indicates the three different basic possible ways of fixing the reference location, namely by mutually delaying the travelling-wave signals, by differing integration intervals, and by multiplying by differing weighting functions, more particularly with mutual temporal displacement. In addition to the ramp functions shown, consideration may more particularly be given for weighting purposes to switching functions with a constant temporal progression in sections or portions, which economises real multiplication in favor of switching over between differing signal-dividers with a constant step-down ratio.

Figure 4:
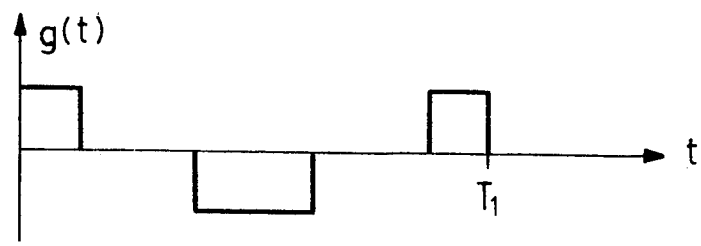
FIG. 4 shows the time diagram of a weighting function which may, for example, be used with selective filtering action.
Figure 5:
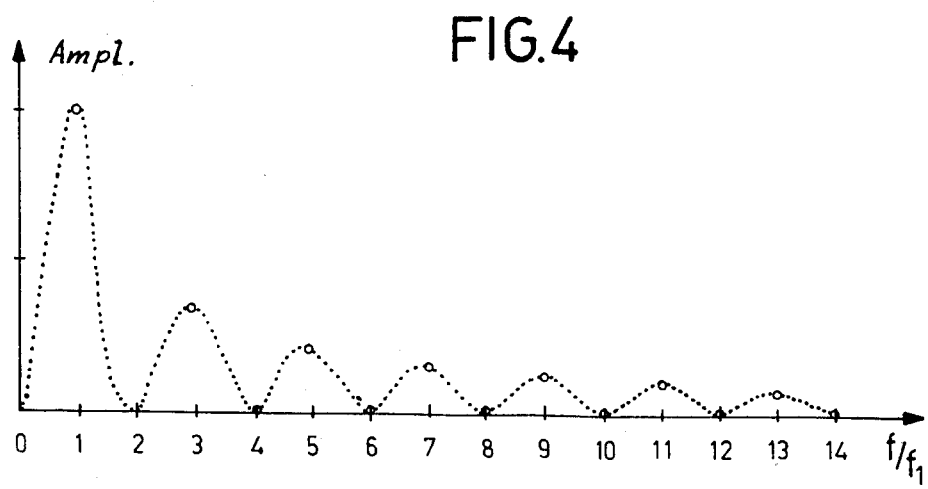
FIG. 5 shows the amplitude spectrum of the weighting function according to FIG. 4.

In particular, weighting functions with a filtering action referred to a predetermined frequency from the spectrum of the travelling-wave signals may also be used in conjunction with the following integration. FIG. 4 indicates an example of such a weighting function with a cycle duration of $T_1$ corresponding to a frequency $f_1$ to be emphasised, and FIG. 5 shows the associated amplitude-frequency characteristic with the main maximum at $f_1$. Time-integrals of the travelling-wave signals obtained in this way are particularly suitable for evaluating functions wherein the magnitude thereof is intended to supply a measure of the distance of the fault from the reference location.

Figure 6:
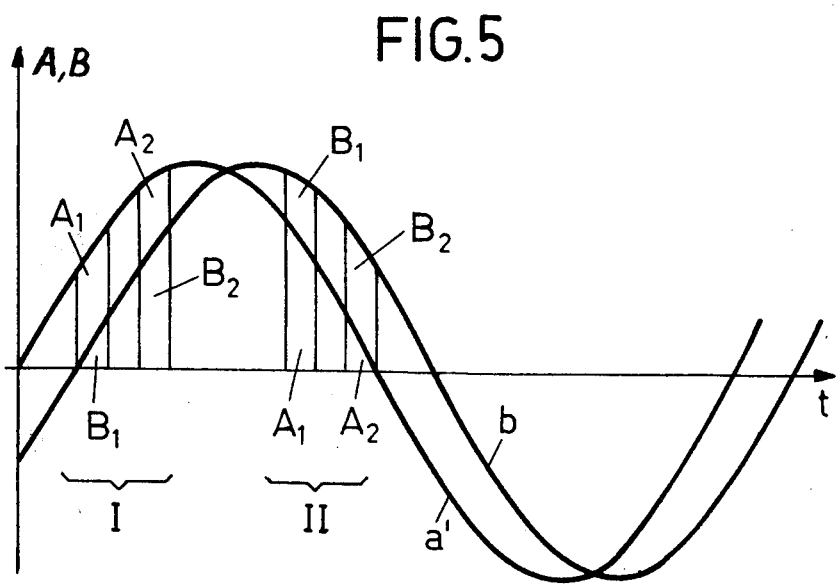
FIG. 6 shows the time diagram of a multiple integration for the travelling-wave signals proceeding in opposite directions.

FIG. 6 shows the formation of a plurality of time-integrals with mutual offset for each travelling-wave signal, namely $A_1$ and $A_2$, and $B_1$ and $B_2$, the integration intervals for $A_1$ and $B_1$ and for $A_2$ and $B_2$ coinciding in each case. For the sake of simplicity, only one frequency component, which is assumed to be dominant, is indicated for the temporal progression of the travelling-wave signals $a'$ and $b$. An evaluating function $F = A_1 \cdot B_2 - A_2 \cdot B_1$ formed for example from said time-integrals has the property of being independent in sign of the phase of the integration intervals with respect to the cycle of the dominant travelling-wave component, and therefore makes the above-mentioned additional phase-detection superfluous. This independence of sign may be checked by observation from the different phases I and II of the time-integrals plotted in FIG. 6.

The aforesaid multiple time-intergrals may furthermore be used in order to form an evaluating function $$F = \arctan \frac{A_1 \cdot B_2 - A_2 \cdot B_1}{A_1 \cdot B_1 + A_2 \cdot B_2} \quad (14)$$

which with integration times of a fraction of the duration of a cycle of the dominant frequency is still proportional to $z - z_R$ with a good approximation, but in any case represents a measure of the fault distance.

Figure 7:
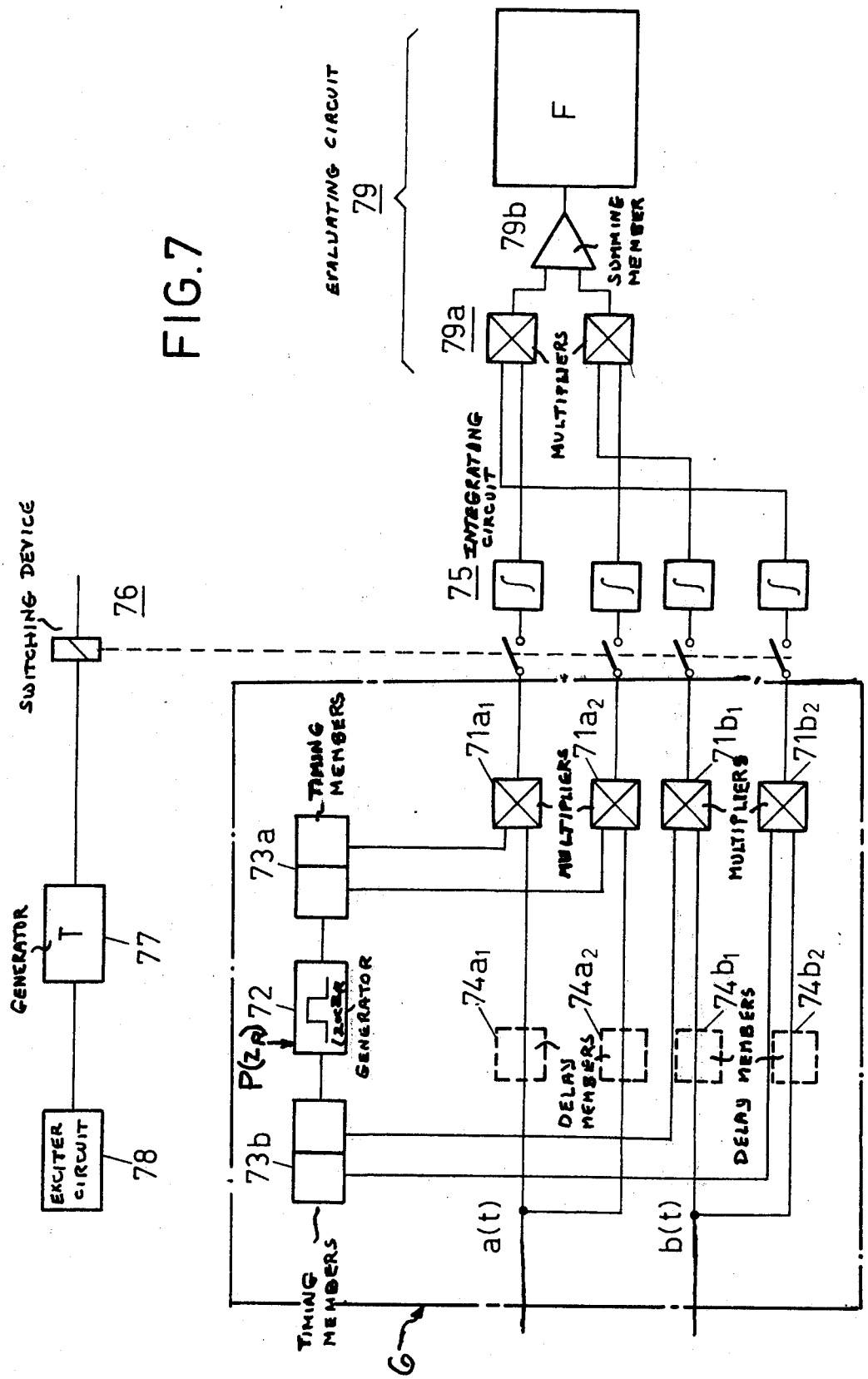
FIG. 7 shows a circuit diagram illustrating the principle of a fault-locating device with determination of reference location and multiple integration for an evaluating function as a means of deciding the direction of the fault location with respect to the reference location.

FIG. 7 shows in detail a circuit arrangement with two signal channels for $a(O,t)$ and $b(O,t)$, split up or branched for multiple integration and each provided with a multiplier $71a1$, $71a2$ and $71b1$, $71b2$ for weighting a rectangular switching function supplied by a generator 72 via timing members $73a$ and $73b$. These timing elements or members comprise for each connected multiplier an associated delay unit, for example capable of being set, for instance in the form of monostable flip-flop stages with a settable switching time, and thus enable any functional portions to be sampled or keyed out of a and b. This enables the reference location to be fixed in the manner hereinbefore explained, and also enables multiple integration to be carried out with unambiguity in the sign of the evaluating function. Alternatively thereto or if desired even additionally, delay members $74a1$, $74a2$, and $74b1$, $74b2$ - advantageously capable of being set - may be provided in the branched signal channels for a and b. After the just described modification circuit 6 there follows an integrating circuit 75 with its own integrator for each differently keyed travelling-wave signal and with a common switching device 76 which is tripped via an integration-interval-generator 77 by a customary fault-indicating excitation circuit 78. In a manner which is obvious and is therefore not illustrated, the switching device also controls the discharge of the integrators after evaluation is finished. Evaluation takes place in an evaluating circuit 79 with multipliers $79a$ and a summing member $79b$ for forming the evaulating function $F = A_1 \cdot B_2 - A_2 \cdot B_1$.

Figure 8:
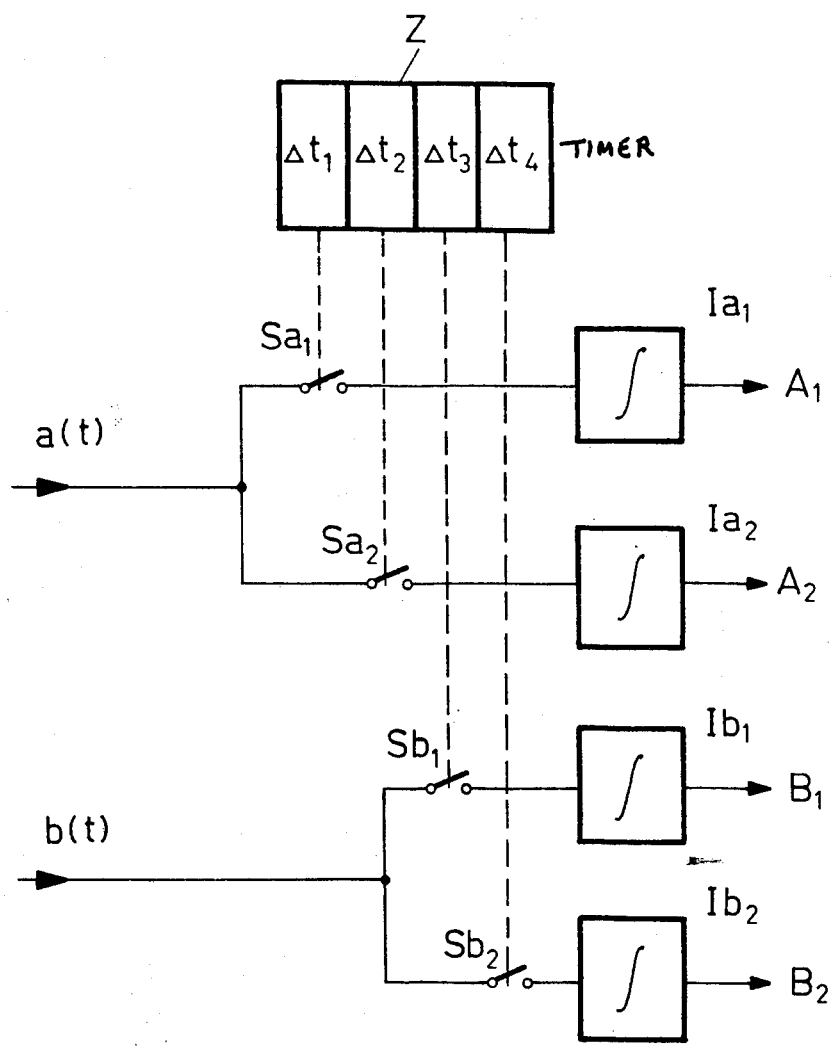
FIG. 8 shows a modified integrating circuit, capable of being used in an arrangement according to FIG. 7, with a different way of measuring the integration interval for determining the reference location and multiple integration.

FIG. 8 shows an embodiment with a different way of generating the integration intervals for the travelling-wave signal channels a and b split up for the purpose of fixing the reference location and multiple integration, via each channel's own switch $Sa1$, $Sa2$ and $Sb1$, $Sb2$ with an associated timer Z for the individual integration intervals $\Delta t_1$ to $\Delta t_4$. The following integrators $Ia1$ to $Ib2$ here also supply the time-integrals $A_1$, $A_2$ and $B_1$, $B_2$ for forming an evaluating function as in accordance with FIG. 7. This circuit corresponds more particularly to multiple integration, as shown in FIG. 6.

Moreover, the intergals for multiple integration according to FIG. 6 may be distinguished not only by imparting different magnitudes to the integration intervals, i.e. mutual displacement of differing duration, but also by different weighting and/or mutual displacement of the travelling-wave signals themselves, and thus likewise in analogous fashion to the measures for fixing the reference location, but in this case the limiting condition as regards the possibility of compensation by temporally displacing the travelling-wave signals does not exist.

It should moreover be noted that the present formation, processing and evaluation of travelling-wave signals is not limited to the introduction of measured signals $u_m$ and $i_m$ proportional to the line voltage and line currents. On the contrary, the measured signals which are first of all proportional to the line voltages and line currents may if desired be additionally transformed, for instance by amplitude-limitation or the addition of voltage or current components in order to obtain sufficient signal levels and the like. The fault location and direction may nevertheless be detected as described in the manner stated. Furthermore, integration may be carried out - even if it is more tediuous and involves greater expenditure on circuit means - with current and voltage signals before the travelling-wave signals are put together.

While there are shown and described present preferred embodiments of the invention, it is to be distinctly understood that the invention is not limited thereto, but may be otherwise variously embodied and practiced within the scope of the following claims.

Accordingly, what is claimed is:

1. A process for locating faults on a line, wherein at least one signal (travelling-wave signal) associated with a travelling wave on the line and corresponding to the temporal progression thereof at the measuring location is formed from the voltage and current at the measuring location, the improvement comprising the steps of: forming pairs of oppositely moving travelling-wave signals corresponding in number to the phases or conductors in the line and decoupled from one another in relation to the line inductances and line capacitances, forming at least two time-integrals with these travelling-wave signals or signals derived therefrom as integrands, each time-integral being associated with one direction of wave-propagation on the line, and processing these time-integrals by an evaluating function to produce a value which characterizes by way of at least any one of its sign and magnitude the direction and distance, respectively, of the fault with respect to a predetermined reference location on the line, which evaluating function corresponds to a relationship prevailing at the fault location between the travelling waves moving in opposite directions on the line.

2. The process according to claim 1, including the step of forming the time-integrals by way of integration intervals which start and end at defined points.

3. The process according to claim 1, subjecting two travelling-wave signals moving in opposite directions to a variation in their temporal progression relatively to one another, said variation causing the evaluating function to assume a predetermined value for a temporal displacement between coincident portions of the travelling-wave signals independent of the progression thereof and corresponding to twice the wave transit time between the measuring location and a reference location, and the evaluating function comprises two subtractively linked signal components formed from the time-integrals of the varied travelling-wave signals moving in opposite directions.

4. The process according to claim 3, wherein the predetermined value of the evaluating function amounts to zero.

5. The process according to claim 3, wherein the temporal progression of the travelling-wave signals moving in opposite directions undergoes at least two different relative variations corresponding to at least two different reference locations on the line, and forming at least two corresponding evaluations in the form of decisions as to the direction of the fault location with respect to the associated reference location, and forming a signal which characterises the position of the fault location as being within or outside the portion of line bounded by the two reference locations by logical linking of these decisions as to direction.

6. The process according to claim 3, wherein there are formed the time-integrals for two travelling-wave signals moving in opposite directions, one time-integral being subjected with respect to the other to a delay corresponding to twice the wave transit time between the measuring location and the reference location.

7. The process according to claim 1, including forming time-integrals for travelling-wave signals multiplied by at least one temporal weighting function.

8. The process according to claim 7, further including the use of weighting functions with a temporal progression which is constant in sections.

9. The process according to claim 8, including the steps of using switching functions as weighting functions.

10. The process according to claim 1, including the step of forming the time-integrals from travelling-wave signals multiplied by at least two different weighting functions.

11. The process according to claim 10, including the step of using weighting functions which can be led into one another as a result of temporal displacement.

12. The process according to claim 11, wherein the weighting functions can be further led into another by multiplication by a temporally constant factor.

13. The process according to claim 11, including the step of forming from travelling-wave signals moving in opposite directions time-integrals which are multiplied by weighting functions displaced with respect to one another by a time-interval corresponding to twice the wave transit time between the measuring location and the reference location.

14. The process according to claim 3, wherein the time-integrals formed from travelling-wave signals moving in opposite directions exhibit integration intervals of at least differing duration.

15. The process according to claim 3, wherein the time-integrals formed from travelling-wave signals moving in opposite directions exhibit integration intervals of at least different position.

16. The process according to claim 1, wherein two travelling-wave signals moving in opposite directions or signals derived therefrom are integrated by way of integration intervals wherein selectively the beginnings, the ends, or both are mutually displaced by a difference interval corresponding to twice the wave transit time between the measuring location and the reference location.

17. The process according to claim 1, including the step of forming at least two time-integrals with a temporal displacement between the travelling-wave signals used for forming the associated integrands for at least one direction of propagation, and forming an evaluating function with at least two substractively linked expressions of these time-integrals from the time-integrals thus obtained.

18. The process according to claim 1, including the step of forming at least two time-integrals with differing integration intervals for at least one direction of propagation and forming an evaluating function with at least two subtractively linked expressions of these time-integrals.

19. The process according to claim 1, including the step of multiplying at least one of the travelling-wave signals moving in opposite directions by at least two different weighting functions, and forming a corresponding number of time-integrals and an evaluating function with at least two subtractively linked products of these time-integrals from the product functions thus obtained for each direction of propagation.

20. The process according to claim 19, including the step of multiplying each travelling-wave signal associated with one direction of propagation by at least two weighting functions temporally displaced with respect to one another.

21. An apparatus for locating faults on a line with respect to a predetermined reference location, comprising:
   a. a voltage- and current-measuring circuit provided at a measuring location on the line, the voltage- and current measuring circuit having outputs carrying voltage-current signal pairs ($u_m$, $i_m$) corresponding in number to the phase or conductors in the line and independent of one another with respect to the line inductances and line capacitances;
   b. a multiplication circuit connected to the voltage- and current-measuring circuit, said multiplication circuit serving for the multiplication of at least one of the independent current signals ($i_m$) by a factor ($R_w$) corresponding to a characteristic impedance associated with the relevant current signal;
   c. a summation circuit having an input side and an output side, said input side being connected to said measuring circuit and to the multiplication circuit, said summation circuit serving for the formation of at least two travelling-wave signals in the form of $a = u_m + R_w \cdot i_m$ and $b = -u_m + R_w \cdot i_m$ with $u_m$ and $i_m$ as the voltage-current signal pair and $R_w$ as the factor corresponding to an associated characteristic impedance;
   d. travelling-wave signal channels connected with the output side of said summation circuit;
   e. a modification circuit incorporated into the travelling-wave signal channels for the purpose of generating a mutual variation in the temporal progression of the travelling-wave signals associated with a reference location on the line;
   f. a integrating circuit for forming time-integrals of the travelling-wave signals and incorporating an integration-interval switching device; and
   e. an evaluating circuit connected to ouputs of the integrating circuit, inputs of said evaluating circuit being fed with time-integrals formed from travelling-wave signals proceeding in opposite directions to one another or signals derived from these time-integrals.

22. The apparatus as defined in claim 21, wherein the evaluating circuit comprises at least one subtraction circuit.

23. The apparatus as defined in claim 21, wherein the evaluating circuit comprises at least one comparison circuit.

24. The apparatus according to claim 21, wherein the modification circuit comprises timing members for imparting a mutual delay to the travelling-wave signals.

25. The apparatus according to claim 21, wherein the modification circuit comprises multipliers with associated function-generators for forming travelling-wave signals differently weighted to correspond to a predetermined reference location.

26. The apparatus according to claim 21, wherein the integration-interval switching device comprises timing members in order to provide a different setting for the integration intervals for the travelling-wave signals proceeding in opposite directions to correspond to a reference location.

27. The apparatus according to claim 21, including travelling-wave signal channels, at least one of the travelling-wave signal channels associated with the opposite directions of propagation is branched for the purpose of forming a plurality of time-integrals, and each of the branch channels thus formed is provided with its own integrator with an integration interval differing with respect to the other branch channel with the same travelling-wave direction.

28. The apparatus according to claim 21, including travelling-wave signal channels, at least one of the travelling-wave signal channels associated with the opposite directions of propagation is branched for the purpose of forming a plurality of time-integrals, and a delay member is provided in each of the branch channels.

29. The apparatus according to claim 21, including travelling-wave signal channels, at least one of the travelling-wave signal channels associated with the opposite directions of propagation is branched for the purpose of forming a plurality of time-integrals, and a multiplier with a weighting-function-generator is provided in each of the branch channels.

30. The apparatus according to claim 21, wherein the integrating circuit is connected to outputs of the summation circuit.

* * * * *